United States Patent [19]
Chinnock

[11] Patent Number: 5,970,177
[45] Date of Patent: *Oct. 19, 1999

[54] DATA COMPRESSION USING SELECTIVE ENCODING

[75] Inventor: Douglas P. Chinnock, Tucson, Ariz.

[73] Assignee: America Online, Inc., Dulles, Va.

[*] Notice: This patent issued on a continued prosecution application filed under 37 CFR 1.53(d), and is subject to the twenty year patent term provisions of 35 U.S.C. 154(a)(2).

[21] Appl. No.: 08/916,828

[22] Filed: Aug. 22, 1997

Related U.S. Application Data

[63] Continuation of application No. 08/477,232, Jun. 7, 1995.

[51] Int. Cl.$^6$ ................................................ H03M 7/30
[52] U.S. Cl. ............................................. 382/244; 395/114
[58] Field of Search ................................ 382/244–247; 358/426–427, 261.1–261.4, 262.1; 395/114

[56] References Cited

U.S. PATENT DOCUMENTS

| | | | |
|---|---|---|---|
| 4,881,075 | 11/1989 | Weng | 341/87 |
| 5,010,344 | 4/1991 | Nagy | 341/65 |
| 5,010,345 | 4/1991 | Nagy | 341/65 |
| 5,488,365 | 1/1996 | Seroussi et al. | 341/51 |

OTHER PUBLICATIONS

D. S. Hirschberg and D. A. Lelewer, "Efficient decoding of prefix codes", Comm. ACM, 33, 4, pp. 449–459, Apr. 1990.
J. Ziv & A. Lempel, "A Universal Algorithm for Sequential Data Compression," IEEE transactions on Information theory, vol. 23, No. 3, pp. 337–343.
D. A. Huffman, "A Method for the Construction of Minimum Redundancy Codes," Proceedings of the Institute of Radio Engineers, vol. 40, No. 9, pp. 1098–1101.
E. S. Schwartz & B. Kallick, "Generating a canonical prefix encoding," Comm. ACM, 7, 3, pp. 166–169 (Mar., 1964).
E. R. Fiala & D. H. Greene, "Data Compression with Finite Windows," Comm. ACM, 32, 4, pp. 490–505 (1989).
R. Sedgewick, "Algorithms", p. 252.

Primary Examiner—Thomas D. Lee
Assistant Examiner—Stephen Brinich
Attorney, Agent, or Firm—Standley & Gilcrest, LLP

[57] ABSTRACT

A data compression method that uses selective encoding is disclosed. A block of data is compressed using a combination of the LZ77 and Huffman coding techniques. Each compressed block consists of a pair of Huffman code trees that describe the representation of the compressed data part and a compressed data part. Compressed data may consist of literal data that has not been detected as duplicated and length/backward pairs indicating the location of a duplicated string. Compressed data is arranged in a deflate format.

8 Claims, 5 Drawing Sheets

Encoding structure

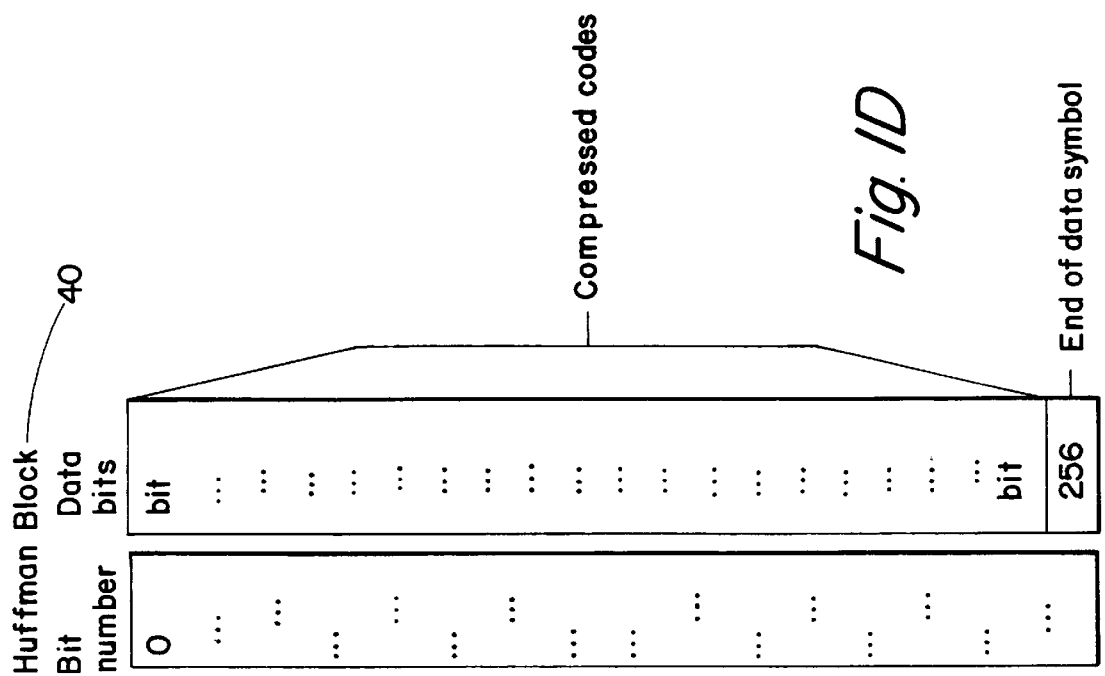
*Fig. IC*
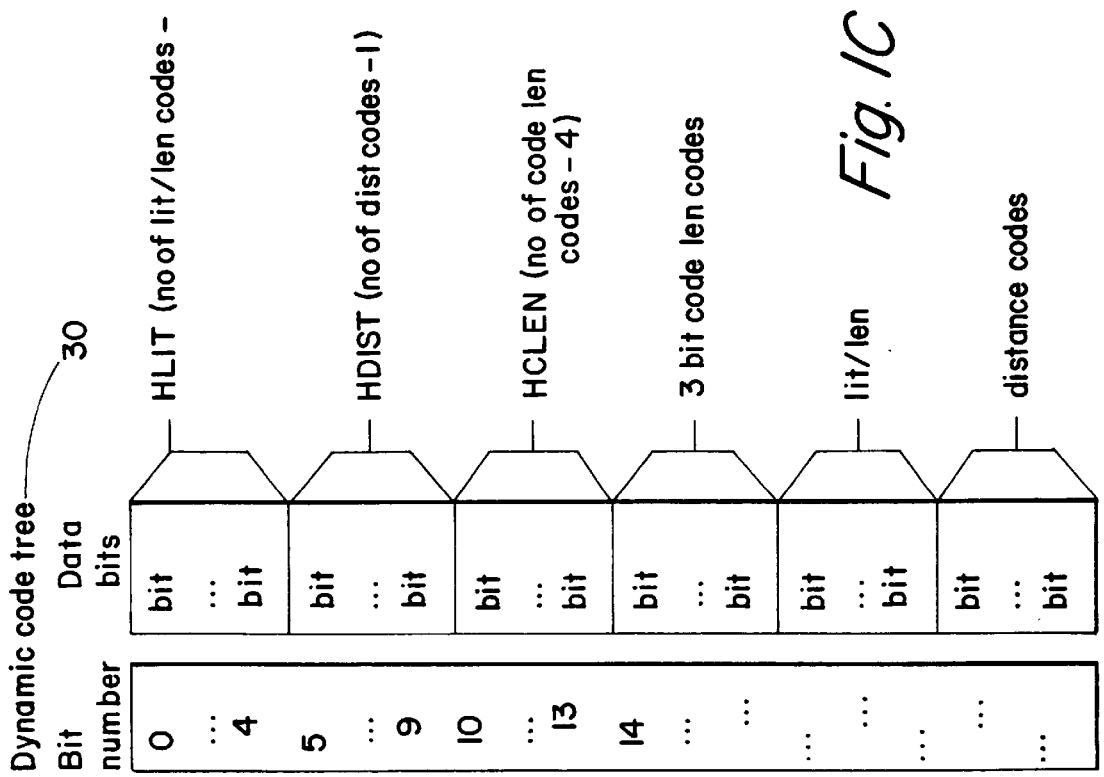
*Fig. ID*

DATA COMPRESSION USING SELECTIVE ENCODING

This application is file wrapper continuation of application Ser. No. 08/477,232 filed June 7, 1995.

RELATED PUBLICATIONS

[LZ77] Ziv J., Lempel A., "A Universal Algorithm for Sequential Data Compression", IEEE Transactions on Information Theory", Vol. 23, No. 3, pp. 337–343.

Huffman, D. A., 'A Method for the Construction of Minimum Redundancy Codes', Proceedings of the Institute of Radio Engineers, September 1952, Volume 40, Number 9, pp. 1098–1101.

Schwartz, E. S., and Kallick, B. "Generating a canonical prefix encoding." Comm. ACM, 7,3 (March 1964), pp. 166–169.

"Efficient decoding of prefix codes", Hirschberg and Lelewer, Comm. ACM, 33,4, April 1990, pp. 449–459.

"Algorithms", R. Sedgewick, Addison-Wesley, p252.

"Data Compression with Finite Windows", Fiala, E. R., and Greene, D. H. Comm. ACM, 32,4, 1989 490–595

BACKGROUND OF THE INVENTION

1. Field of the Invention

The present invention relates to a method for representing a sequence of octets as a sequence of bits and a method for packing the latter bit sequence into octets, and more particularly to adaptive and invertible or lossless digital data compression systems.

2. Description of the Prior Art

The following definitions of terms and conventions are used:

code: a sequence of bits of arbitrary length octet: 8 bits stored or transmitted as a unit.

string: a sequence of arbitrary octets.

block: a string of input octets.

compressed data set: a series of output blocks, corresponding to successive blocks of input data.

LZ77 Compression Method

Many data compression methods have been derived from improvements to a compression technique developed by Lempel and Ziv and published in 1977. In this method, a large input store is maintained. Input bytes are put in this store as they are received. The decompressor must keep an identical copy of this store as it expands data. As strings of bytes are input, the store is searched to locate previous occurrences. If no previous occurrence (longer than some minimum length) is found, the bytes themselves are used. If an identical previous sequence (longer than some minimum length) is found, the position and length of that occurrence is used. Positions and lengths are encoded in a way to distinguish them from literal characters. The encoded stream is sent to the decoder.

The decoder interprets codes as it accepts them. As it decodes literal characters, it appends them to its output store. When it decodes a position and length, it refers to its output store to obtain the specific string to copy and append to the output store. Thus, the decompression process parallels the compression process and keeps an identical store that is used to refer to previous strings.

Improvements to LZ77 Method

Extensive searching is required to locate the longest previous occurrences. There is a practical limit to the size that the store can take. Additional compression techniques can be applied to the data stream. Variations of solutions to enhance LZ77 have been made. The improvement disclosed herein is mostly based on the 'deflate' method. The 'deflate' format and compression algorithm was developed by Jean-loup Gailly in 1992. The block formats and Huffman codes were defined therein. The format is used extensively on the Internet and in commercial products (such as Pkware's PKZIP).

Location of the longest previous sequence that matches the current sequence made use of hashing chains. Huffman coding is applied to the encoded literal strings, displacements, and lengths.

Synopsis of Prefix and Huffman Coding

Prefix coding represents symbols from an a priori known alphabet by bit sequences (codes), one code for each symbol, in a manner such that different symbols may be represented by bit sequences of different lengths. A parser can always parse an encoded string unambiguously symbol-by-symbol.

A prefix code is defined in terms of a binary tree in which the two edges descending from each non-leaf node are labeled 0 and 1 and in which the leaf nodes correspond one-for-one with (are labeled with) the symbols of the alphabet; then the code for a symbol is the sequence of 0's and 1's on the edges leading from the root to the leaf labeled with that symbol. For example:

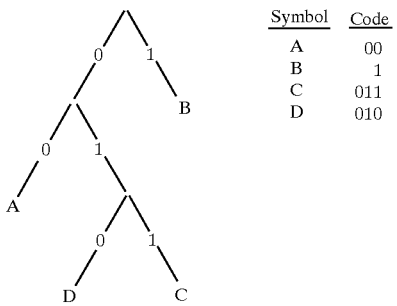

| Symbol | Code |
|--------|------|
| A | 00 |
| B | 1 |
| C | 011 |
| D | 010 |

A parser can decode the next symbol from an encoded input stream by walking down the tree from the root, at each step choosing the edge corresponding to the next input bit.

Given an alphabet with known symbol frequencies, the Huffman algorithm allows the construction of an optimal prefix code (one which represents strings with those symbol frequencies using the fewest bits of any possible prefix codes for that alphabet). Such a code is called a Huffman code. (See the references for additional information on Huffman codes.)

The Huffman codes used for each alphabet in the 'deflate' format have two additional rules:

All codes of a given bit length have lexicographically consecutive values, in the same order as the symbols they represent; and Shorter codes lexicographically precede longer codes.

Recoding the example above to follow this rule as follows, assuming that the order of the alphabet is ABCD:

| Symbol | Code |
|--------|------|
| A | 10 |
| B | 0 |
| C | 110 |
| D | 111 |

I.e., 0 precedes 10 which precedes 11x, and 110 and 111 are lexicographically consecutive.

Given this rule, one can define the Huffman code for an alphabet just by giving the bit lengths of the codes for each symbol of the alphabet in order; this is sufficient to determine the actual codes. In our example, the code is completely defined by the sequence of bit lengths (2, 1, 3, 3). The following algorithm generates the codes as integers, intended to be read from most- to least-significant bit. The code lengths are initially in tree[I].Len; the codes are produced in tree[I].Code.

1) Count the number of codes for each code length. Let bl_count[N] be the number of codes of length N, N>=1.
2) Find the numerical value of the smallest code for each code length:

```
code = 0;
bl_count[0] = 0;
for (bits = 1; bits <= MAX_BITS; bits++)
    {
    next_code[bits] = code = (code + bl_count[bits-1]) << 1;
    }
```

3) Assign numerical values to all codes, using consecutive values for all codes of the same length with the base values determined at step 2. Codes that are never used (which have a bit length of zero) must not be assigned a value.

```
for (n = 0; n <= max_code; n++)
    {
    len = tree[n].Len;
    if (len == 0)
        continue;
    tree[n].Code = next_code[len]++;
    }
```

EXAMPLE

Consider the alphabet ABCDEFGH, with bit lengths (3, 3, 3, 3, 3, 2, 4, 4). After step 1::

| N | bl_count [N] |
|---|---|
| 2 | 1 |
| 3 | 5 |
| 4 | 2 |

Step 2 computes the following next_code values:

| N | next_code [N] |
|---|---|
| 1 | 0 |
| 2 | 0 |
| 3 | 2 |
| 4 | 14 |

Step 3 produces the following code values:

| Symbol | Length | Code |
|---|---|---|
| A | 3 | 010 |
| B | 3 | 011 |
| C | 3 | 100 |
| D | 3 | 101 |
| E | 3 | 110 |

| Symbol | Length | Code |
|---|---|---|
| F | 2 | 00 |
| G | 4 | 1110 |
| H | 4 | 1111 |

SUMMARY OF THE INVENTION

A compressed data set consists of a series of blocks, corresponding to successive blocks of input data. The block sizes are arbitrary, except that uncompressible blocks are limited to 65,535 octets.

Each block is compressed using a combination of the LZ77 algorithm and Huffman coding. The Huffman trees for each block are independent of those for previous or subsequent blocks. The LZ77 algorithm refers to a duplicated string occurring in a previous block, up to 32K input octets before.

Each block consists of two parts:

a pair of Huffman code trees that describe the representation of the compressed data part; and a compressed data part. (The Huffman trees themselves are compressed using Huffman encoding.)

The compressed data consists of a series of elements of two types:

literal octets (of strings that have not been detected as duplicated within the previous 32K input octets); and pointers to duplicated strings, where a pointer is represented as a pair <length, backward distance>.

The compressed data set is arranged in a format herein called the 'deflate' format.

The representation used in the 'deflate' format limits distances to 32K octets and lengths to 258 octets, but does not limit the size of a block, except for uncompressible blocks, which are limited as noted above.

Each type of value (literals, distances, and lengths) in the compressed data is represented using a Huffman code, using one code tree for literals and lengths and a separate code tree for distances. The code trees for each block appear in a compact form just before the compressed data for that block.

DETAILED DESCRIPTION OF PREFERRED EMBODIMENT

Figure 1A:
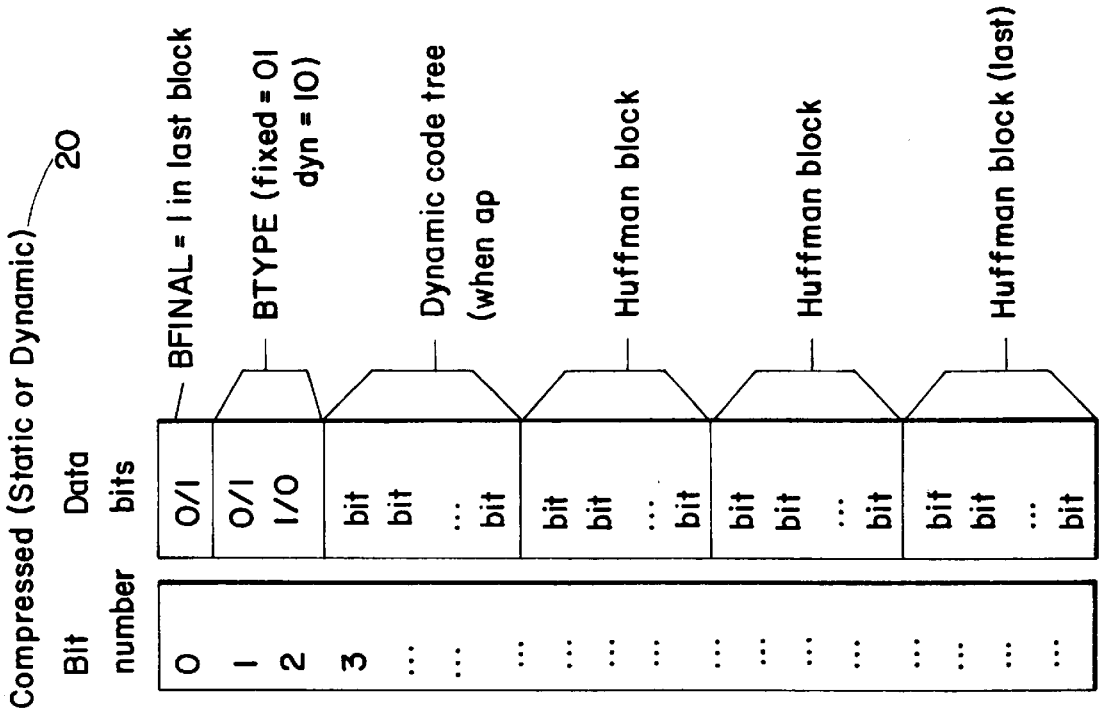
FIG. 1 is a diagrammatic representation of the block formats.

The following conventions are used.
In the diagrams below, a box like this:

represents one octet; a box like this:

represents a variable number of octets.

Octets stored within a computer do not have a 'bit order', since they are always treated as a unit. However, an octet considered as an integer between 0 and 255 does have a most- and least-significant bit, and because numbers are written with the most-significant digit on the left, octets are also written with the most-significant bit on the left. In the diagrams below, the bits of an octet are numbered so that bit 0 is the least-significant bit, i.e., the bits are numbered:

Within a computer, a number may occupy multiple octets. All multi-octet numbers in the format described here are stored with the least-significant octet first (at the lower memory address). For example, the decimal number 520 is stored as:

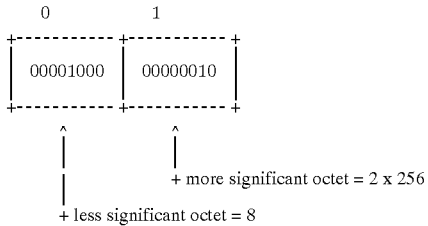

Packing into Octets

This embodiment does not address the issue of the order in which bits of an octet are transmitted on a bit-sequential medium, because the final data format described here is octet- rather than bit-oriented. However, it describes the compressed block format below as a sequence of data elements of various bit lengths, not a sequence of octets. It therefore specifies how to pack these data elements into octets to form the final compressed octet sequence:

- Data elements are packed into octets in order of increasing bit number within the octet, i.e., starting with the least-significant bit of the octet.
- Data elements other than Huffing codes are packed starting with the least-significant bit of the data element.
- Huffman codes are packed starting with the most-significant bit of the code.

In other words, if one were to print out the compressed data as a sequence of octets, starting with the first octet at the *right* margin and proceeding to the *left*, with the most-significant bit of each octet on the left as usual, one would be able to parse the result from right to left, with fixed-width elements in the correct MSB-to-LSB order and Huffing codes in bit-reversed order (i.e., with the first bit of the code in the relative LSB position).

Details of Block Format

Each block of compressed data begins with 3 header bits containing the following data:

| first bit | BFINAL |
| next 2 bits | BTYPE |

Note that the header bits do not necessarily begin on a octet boundary, since a block does not necessarily occupy an integral number of octets.

BFINAL is set if this is the last block of the data set.

BTYPE specifies how the data are compressed, as follows:

00—no compression
01—compressed with fixed Huffman codes
10—compressed with dynamic Huffman codes
11—reserved (error)

In all cases, the decoding algorithm for the actual data is as follows:

```
do
    read block header from input stream.
    if stored with no compression
        skip any remaining bits in current partially processed octet
        read LEN and NLEN (see next section)
        copy LEN octets of data to output
    otherwise
        if compressed with dynamic Huffman codes
            read representation of code trees (see subsection below)
        loop (until end of block code recognized)
            decode literal/length value from input stream
            if value < 256
                copy value (literal octet) to output stream
            otherwise
                if value = end of block (256)
                    break from loop
                otherwise (value = 257..285)
                    decode distance from input stream
                    move backwards distance octets in the output
                    stream
                        copy length octets from this position to the
                        output stream.
        end loop
while not last block
```

Note that a duplicated string reference may refer to a string in a previous block; i.e., the backward distance may cross one or more block boundaries. Note also that the referenced string may overlap the current position; for example, if the last 2 octets decoded have values X and Y, a string reference with <length=5, distance=2> adds X,Y,X,Y,X to the output stream.

Figure 1B:
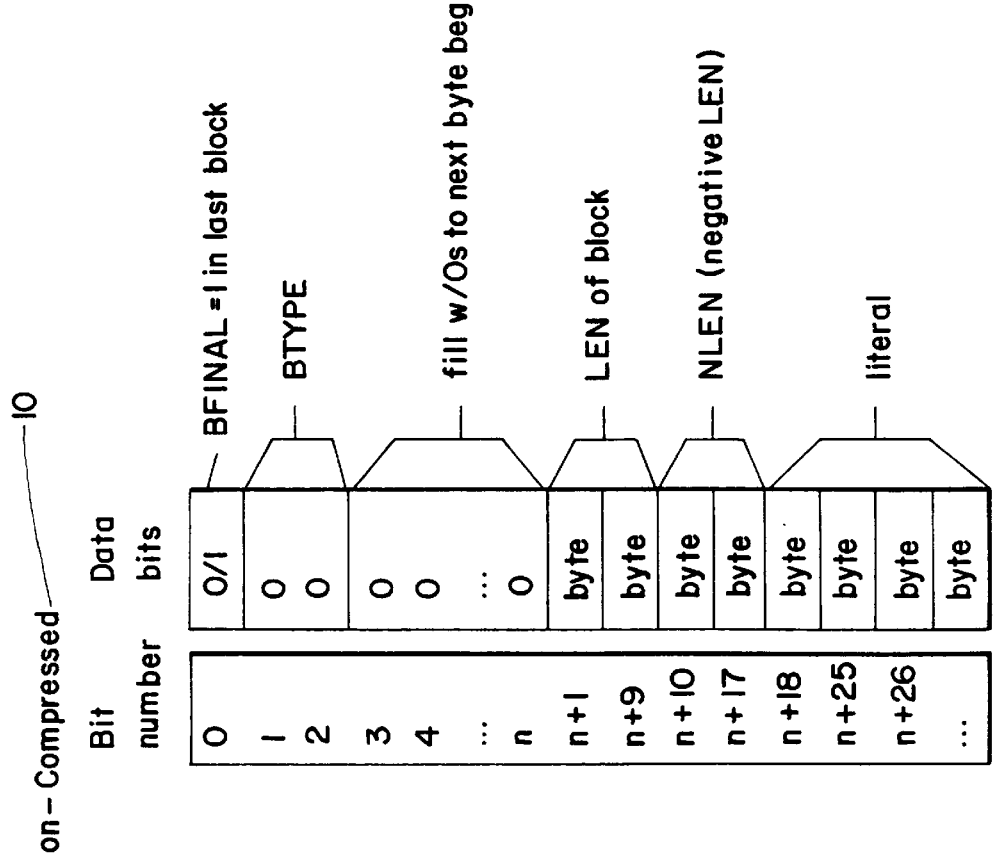

Referring to FIG. 1, the details of each block type are shown.

Non-compressed Blocks (BTYPE=00)

As shown in FIG. 1, for non-compressed data 10, any bits of input up to the next octet boundary are ignored. The rest of the block consists of the following information:

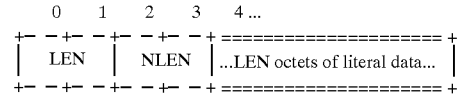

LEN is the number of data octets in the block. NLEN is the one's complement of LEN.

Compressed Blocks

As shown in FIG. 1, for compressed blocks 20, as noted above, encoded data blocks in the 'deflate' format consist of sequences of symbols drawn from three conceptually distinct alphabets:

literal octets, from the alphabet of octet values (0 . . . 255);

length, where the length has the range of values (3 . . . 258) to compose <length, backward-distance> pairs; and distance, which has values (1 . . . 32,768) to compose <length, backward-distance>pairs.

Literal and length alphabets are merged into a single alphabet (0 . . . 285), where values 0 . . . 255 represent literal octets, the value 256 indicates end-of-block, and values 257 . . . 285 represent length codes (possibly in conjunction with extra bits following the symbol code) as follows:

| Code | Extra Bits | Length |
|------|------------|--------|
| 257 | 0 | 3 |
| 258 | 0 | 4 |
| 259 | 0 | 5 |
| 260 | 0 | 6 |
| 261 | 0 | 7 |
| 262 | 0 | 8 |
| 263 | 0 | 9 |
| 264 | 0 | 10 |
| 265 | 1 | 11,12 |
| 266 | 1 | 13,14 |
| 267 | 1 | 15,16 |
| 268 | 1 | 17,18 |
| 269 | 2 | 19–22 |
| 270 | 2 | 23–26 |
| 271 | 2 | 27–30 |
| 272 | 2 | 31–34 |
| 273 | 3 | 35–42 |
| 274 | 3 | 43–50 |
| 275 | 3 | 51–58 |
| 276 | 3 | 59–66 |
| 277 | 4 | 67–82 |
| 278 | 4 | 83–98 |
| 279 | 4 | 99–114 |
| 280 | 4 | 115–130 |
| 281 | 5 | 131–162 |
| 282 | 5 | 163–194 |
| 283 | 5 | 195–226 |
| 284 | 5 | 227–257 |
| 285 | 0 | 258 |

The extra bits should be interpreted as a machine integer stored with the most-significant bit first, e.g., bits 1110 represent the value 14.

The only difference between the two compressed cases is how the Huffman codes for the literal/length and distance alphabets are defined.

Compression with Fixed Huffman Codes (BTYPE=01

As shown in FIG. 1, the Huffman codes for the two alphabets are fixed, and are not represented explicitly in the data 40. The Huffman code lengths for the literal/length alphabet are:

| Lit Value | Bit | Codes | |
|-----------|-----|-------|---|
| 0–143 | 8 | 00110000 | through 10111111 |
| 144–255 | 9 | 110010000 | through 111111111 |
| 256–279 | 7 | 0000000 | through 0010111 |
| 280–287 | 8 | 11000000 | through 11000111 |

The code lengths are sufficient to generate the actual codes, as described above; the codes in the table is shown for added clarity. Literal/length values 286–287 will never actually occur in the compressed data, but participate in the code construction.

Distance codes 0–31 are represented by (fixed-length) 5-bit codes, with possible additional bits as shown in the following table. Note that distance codes 30–31 will never actually occur in the compressed data.

| Code | Extra Bits | Distance |
|------|------------|----------|
| 0 | 0 | 1 |
| 1 | 0 | 2 |
| 2 | 0 | 3 |
| 3 | 0 | 4 |
| 4 | 1 | 5,6 |
| 5 | 1 | 7,8 |
| 6 | 2 | 9–12 |
| 7 | 2 | 13–16 |
| 8 | 3 | 17–24 |
| 9 | 3 | 25–32 |
| 10 | 4 | 33–48 |
| 11 | 4 | 49–64 |
| 12 | 5 | 65–96 |
| 13 | 5 | 97–128 |
| 14 | 6 | 129–192 |
| 15 | 6 | 193–256 |
| 16 | 7 | 257–384 |
| 17 | 7 | 385–512 |
| 18 | 8 | 513–768 |
| 19 | 8 | 769–1024 |
| 20 | 9 | 1025–1536 |
| 21 | 9 | 1537–2048 |
| 22 | 10 | 2049–3072 |
| 23 | 10 | 3073–4096 |
| 24 | 11 | 4097–6144 |
| 25 | 11 | 6145–8192 |
| 26 | 12 | 8193–12288 |
| 27 | 12 | 12289–16384 |
| 28 | 13 | 16385–24576 |
| 29 | 13 | 24577–32768 |

Compression with Dynamic Huffman Codes (BTYPE=10)

As shown in FIG. 1, for the dynamic code tree 30, the Huffman codes for the two alphabets appear in the block immediately after the header bits and before the actual compressed data. The literal/length code appears first followed by the distance code. Each code is defined by a sequence of code lengths, as discussed above. For even greater compactness, the code length sequences themselves are compressed using a Huffman code. The alphabet for code lengths is as follows:

0–15: Represent code lengths of 0–15
  16: Copy the previous code length 3–6 times.
    The next 2 bits indicate repeat length (0 = 3, ... , 3 = 6)
      Example: Codes 8, 16 (+2 bits 11), 16 (+2 bits 10) will expand to
        12 code lengths of 8 (1 + 6 + 5)
  17: Repeat a code length of 0 for 3–10 times.
    (3 bits of length)
  18: Repeat a code length of 0 for 11–138 times.
    (7 bits of length)

A code length of 0 indicates that the corresponding symbol in the literal/length or distance alphabet will not occur in the block, and should not participate in the Huffman code construction algorithm given earlier. The format of the block is defined as follows:

5 Bits: HLIT, # of Literal/Length codes-257    (257–286)
5 Bits: HDIST, # of Distance codes-1    (1–32)
4 Bits: HCLEN, # of Code Length codes-4    (4–19)
(HCLEN + 4) x 3 bits: code lengths for the code length
           alphabet given just above, in
           the order:
           16, 17, 18, 0, 8, 7, 9, 6, 10, 5,
           11, 4, 12, 3, 13, 2, 14, 1, 15
           These code lengths are interpreted as -continued

| | |
|---|---|
| | 3-bit integers (0–7); as above, a code length of 0 means the corresponding symbol (literal/length or distance code length) is not used. |
| HLIT + 257: | code lengths for the literal/length alphabet, encoded using the code length Huffman code |
| HDIST + 1: | code lengths for the distance alphabet, encoded using the code length Huffman code |
| The actual compressed data of the block: | encoded using the literal/length and distance Huffman codes |
| The literal/length symbol 256 (end of data) | encoded using the literal/length Huffman code |

A compressor may limit further the ranges of values specified in the previous section and still be compliant; for example, it may limit the range of backward pointers to some value smaller than 32K. Similarly, a compressor may limit the size of blocks so that a compressible block fits in memory. A compliant decompressor may accept the full range of possible values defined in the previous section and may accept blocks of arbitrary size.

Compression Algorithm Details

Figure 2:
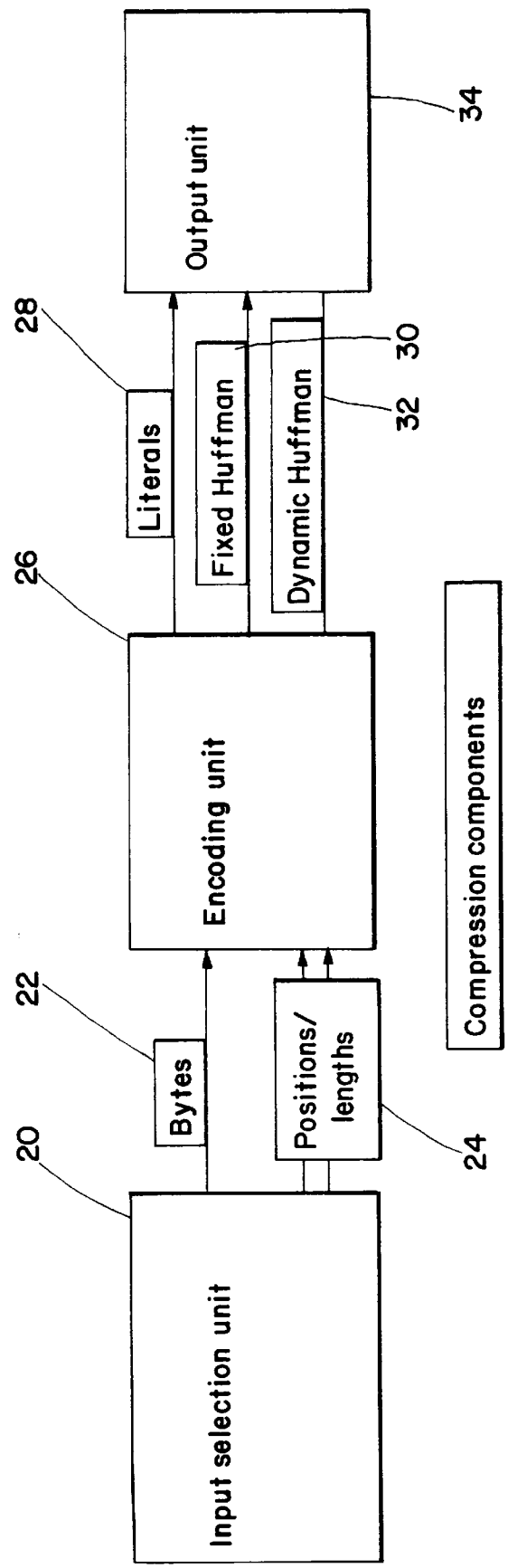
FIG. 2 is a diagrammatic representation of the input selection data.

Referring to FIG. 2, the components that perform the compression operations are shown. Data bytes 22 and position/length data 24 are transferred from the input selection unit 20 to the encoding unit 26. The encoding unit 26 performs the compression operations and sends to the output unit literals 28, Fixed Huffman data 30, and Dynamic Huffman data 32. In alternative embodiments, all operations may be performed within a single unit or may be spread across more than 3 units.

Figure 3:
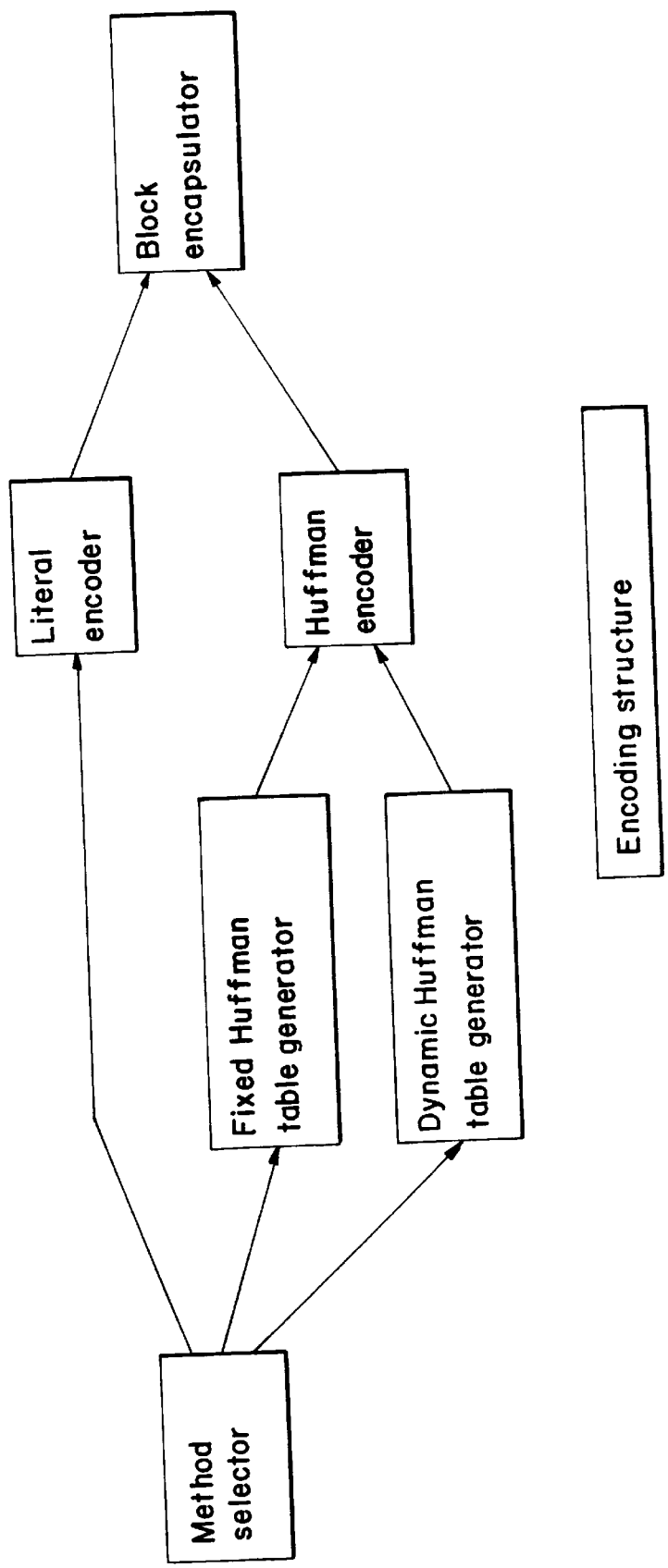
FIG. 3 is a schematic diagram of the encoding structure.

Referring to FIG. 3, the structure for encoding data is shown. Based on the method to be used 50, data is transferred through the literal encoder 56 to the block encapsulator 60 or it is processed through the Fixed Huffman table generator 52 or the Dynamic Huffman table generator 54, to the Huffman encoder and then to the block encapsulator.

The compressor terminates a block when it determines that starting a new block with fresh trees would be useful or when the block size fills up the compressor's block buffer.

Figure 4:
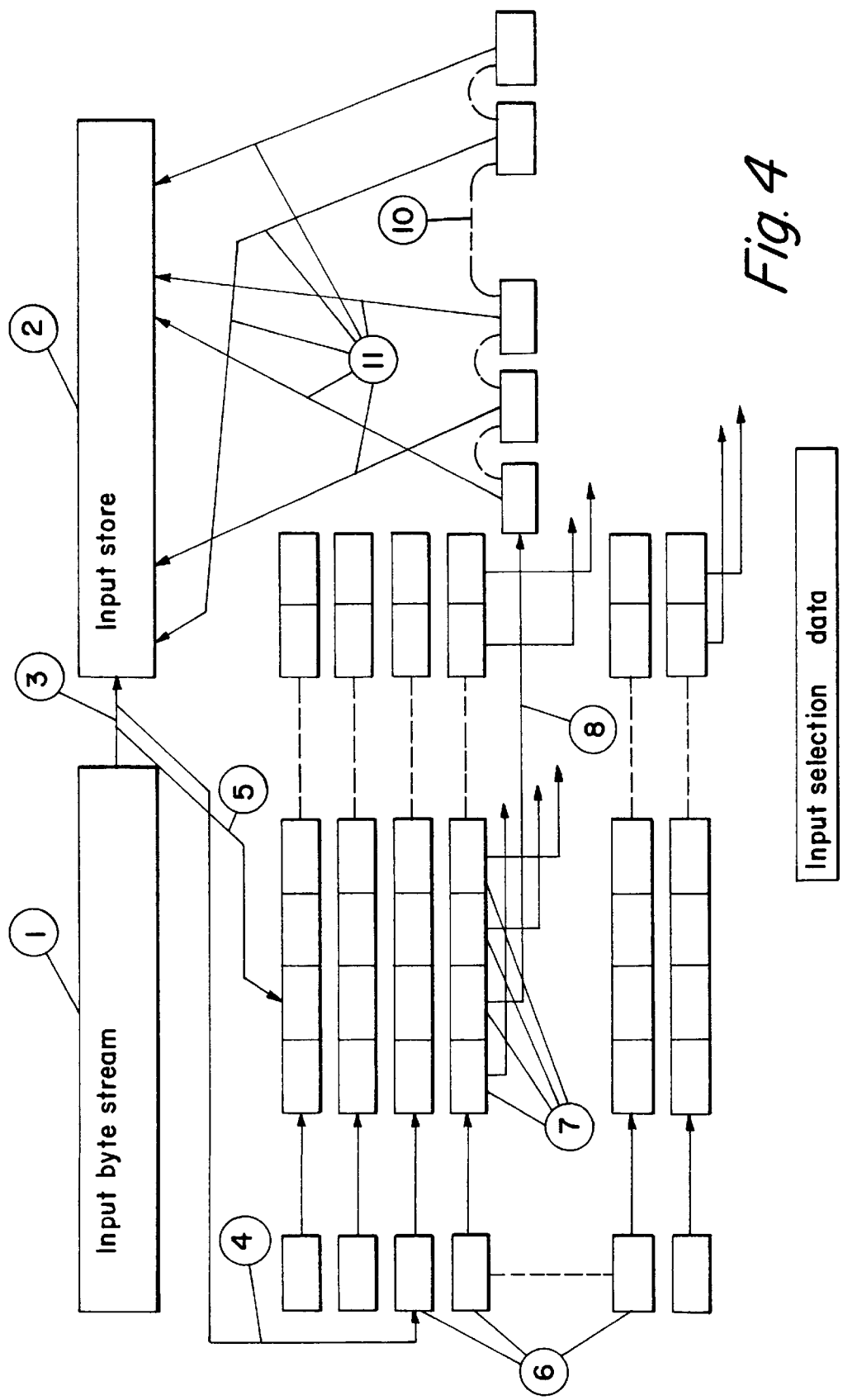
FIG. 4 is a schematic diagram of the compression components.

Referring to FIG. 4, the compressor uses multiple chained index tables 10 to find duplicated strings. Operating on 2-octet sequences 3, the first octet 4 is used to select a table of chains 6; the second octet 5 is used to determine which chain 7 is selected. For example, at any given point during compression, let XY be the next 2 input octets to be examined (not necessarily different, of course). First, the compressor examines the chain for XY. If the chain is empty, the compressor simply writes out X as a literal octet and advances one octet in the input. If the chain is not empty, indicating that the sequence XY has occurred recently, the compressor compares all strings on the XY chain 10 with the actual input data sequence starting at the current point 3, and selects the longest match. Once that match is found, the compressor simply writes out the position and length as a coded pair and advances the number of octets in the input byte stream 1 and the input store 2.

The compressor searches the chains 11 starting with the most recent strings to favor small distances and thus take advantage of the Huffman encoding. The chains are singly linked. Previous occurrences comprise the remainder of each chain 10. There are no deletions from the chains; the algorithm simply discards matches that are too old as they overflow the input store. To avoid a worst-case situation, very long chains are arbitrarily truncated at a certain length determined by a run-time parameter.

To improve overall compression, the compressor optionally defers the selection of matches ("lazy matching"): after a match of length N has been found, the compressor searches for a longer match starting at the next input octet. If it finds a longer match, it truncates the previous match to a length of one (thus producing a single literal octet) and then emits the longer match. Otherwise, it emits the original match and, as described above, advances N octets before continuing.

Run-time parameters also control this "lazy match" procedure. If compression ratio is most important, the compressor attempts a complete second search regardless of the length of the first match. In the normal case, if the current match is "long enough", the compressor reduces the search for a longer match, thus speeding up the process. If speed is most important, the compressor inserts new strings in the table only when no match was found or when the match is not "too long." This degrades the compression ratio, but saves time because there are both fewer insertions and fewer searches.

What is claimed is:

1. A data compression system comprising:

an input store for receiving and storing a plurality of bytes of uncompressed data from an input source;

a data processing means for processing successive bytes of data from said input source;

a sequence of successive bytes to be processed by said data processing means;

an identification means included in said data processing means for identifying a sequence of successive bytes already processed identical to said sequence of successive bytes to be processed;

a plurality of index tables one of which is selected by a first byte in said sequence of successive bytes to be processed, said index tables comprising pointers to already processed byte sequences;

an entry in said index table selected by said first byte such that said entry is selected by a second byte in said sequence of successive bytes to be processed;

a pointer to a head of a chain of already processed byte sequences with same said first byte and said second byte, said pointer being a part of said entry in one of said plurality of index tables;

a selection means for finding a longest sequence of successive bytes already processed that matches said sequence of successive bytes to be processed from said byte sequences in said chain of already processed byte sequences;

a first encoding means for transferring to a processing unit each literal byte not found by said selection means to match one of said already processed byte sequences; and a second encoding means for transferring to said processing unit a position and a length of said longest sequence of successive bytes already processed.

2. A system as claimed in claim 1, in which said processing unit selectively applies Huffman encoding techniques to said literal bytes, said positions, and said lengths transferred to it.

3. A system as claimed in claim 2, in which said selectively applied Huffman encoding techniques include use of predefined Huffman codes and dynamic Huffman codes.

4. A system as claimed in claim 1, in which said processing unit applies said encoded bytes, positions, and lengths to an output transfer medium identifying an encoding method and a classification of each encoded item.

5. A method for compressing data compression comprising the steps of:

receiving and storing in an input store a plurality of bytes of uncompressed data from an input source;

processing successive bytes of data from said input source;

locating from said input source a sequence of successive bytes to be processed;

identifying a sequence of successive bytes already processed identical to said sequence of successive bytes to be processed;

selecting by a first byte in said sequence of successive bytes to be processed one of a plurality of index tables, said index tables comprising pointers to already processed byte sequences;

selecting by a second byte in said sequence of successive bytes to be processed an entry in said index table selected by said first byte;

setting a pointer to a head of a chain of already processed byte sequences with same said first byte and said second byte, said pointer being a part of said entry in one of said plurality of index tables;

finding a longest sequence of successive bytes already processed that matches said sequence of successive bytes to be processed from said byte sequences in said chain of already processed byte sequences;

encoding each literal byte not found by said selection means to match one of said already processed byte sequences;

transferring said encoded literal byte to a processing unit;

encoding a position and a length of said longest sequence of successive bytes already processed; and;

transferring said encoded position and length to said processing unit.

6. The method of claim 5 further comprising the step of selectively applying Huffman encoding techniques to said encoded literal bytes, said encoded positions, and said encoded lengths transferred to said processing unit.

7. The method of claim 6 in which said selectively applied Huffman encoding techniques include use of predefined Huffman codes and dynamic Huffman codes.

8. The method of claim 5 further comprising the step of applying said encoded bytes, positions, and lengths to an output transfer medium identifying an encoding method and a classification of each encoded item.

\* \* \* \* \*